(12) United States Patent
Shelsky et al.

(10) Patent No.: US 9,460,993 B2
(45) Date of Patent: Oct. 4, 2016

(54) INTERPOSER WITH SIGNAL-CONDITIONED EDGE PROBE POINTS

(71) Applicants: Robert C. Shelsky, Nashua, NH (US); Kenneth W. Graham, Plainville, MA (US); Dennis D. Everson, Banks, OR (US)

(72) Inventors: Robert C. Shelsky, Nashua, NH (US); Kenneth W. Graham, Plainville, MA (US); Dennis D. Everson, Banks, OR (US)

( * ) Notice: Subject to any disclaimer, the term of this patent is extended or adjusted under 35 U.S.C. 154(b) by 0 days.

(21) Appl. No.: 15/050,116

(22) Filed: Feb. 22, 2016

(65) Prior Publication Data

US 2016/0172293 A1 Jun. 16, 2016

Related U.S. Application Data

(63) Continuation-in-part of application No. 13/769,382, filed on Feb. 17, 2013, now abandoned.

(60) Provisional application No. 61/601,137, filed on Feb. 21, 2012.

(51) Int. Cl.

| | |
|---|---|
| *G01R 31/00* | (2006.01) |
| *H01L 23/498* | (2006.01) |
| *H05K 1/16* | (2006.01) |
| *G01R 31/28* | (2006.01) |
| *G01R 1/04* | (2006.01) |
| *H05K 1/02* | (2006.01) |
| *H05K 1/14* | (2006.01) |
| *H05K 3/00* | (2006.01) |
| *H05K 3/34* | (2006.01) |
| *H05K 3/40* | (2006.01) |
| *H05K 3/42* | (2006.01) |

(52) U.S. Cl.
CPC ....... *H01L 23/49838* (2013.01); *G01R 1/0408* (2013.01); *G01R 31/2818* (2013.01); *G01R 31/2884* (2013.01); *G01R 31/2889* (2013.01); *H01L 23/49827* (2013.01); *H05K 1/0268* (2013.01); *H05K 1/167* (2013.01); *H05K 1/141* (2013.01); *H05K 3/0052* (2013.01); *H05K 3/3431* (2013.01); *H05K 3/403* (2013.01); *H05K 3/426* (2013.01); *H05K 2201/10378* (2013.01); *Y10T 29/49149* (2015.01)

(58) Field of Classification Search
CPC .......... G01R 1/07307; G01R 1/07342; G01R 31/26; G01R 31/2642; G01R 31/2648; G01R 31/2831; G01R 31/31702
See application file for complete search history.

(56) References Cited

U.S. PATENT DOCUMENTS

| | | | | |
|---|---|---|---|---|
| 5,258,648 | A * | 11/1993 | Lin | G01R 31/2863 257/747 |
| 6,020,749 | A * | 2/2000 | Morris | G01R 1/07378 324/756.05 |
| 2003/0156396 | A1* | 8/2003 | Pearson | H05K 3/3436 361/767 |

*Primary Examiner* — Tung X Nguyen
(74) *Attorney, Agent, or Firm* — Mohr Intellectual Property Law Solutions, PC (57) ABSTRACT

An interposer comprising an array of top contacts on the top surface configured to interface with an integrated circuit package, a corresponding array of bottom contacts on the bottom surface configured to interface with a component beneath the interposer, through connections between corresponding top and bottom contacts and a plurality of signal probe points on the edge surface. The interposer may include an electrical pathway connecting a first through connection to a first signal probe point. The electrical pathway may contact the first through connection at a first intersection. A resistor may be disposed along the electrical pathway, between the first intersection and the first signal probe point. The electrical pathway from the first intersection to the resistor may be an unconditioned signal pathway. The electrical pathway from the resistor to the first signal contact may be a conditioned signal pathway. The unconditioned signal pathway may have a length of not greater than 0.20 inch.

15 Claims, 7 Drawing Sheets

INTERPOSER WITH SIGNAL-CONDITIONED EDGE PROBE POINTS

PRIORITY

This patent application claims priority to and is a continuation-in-part of U.S. patent application Ser. No. 13/769,382 filed on Feb. 17, 2013 Now abandoned titled Interposer with Edge Probe Points, which is hereby incorporated by reference. U.S. patent application Ser. No. 13/769,382 claims priority to U.S. patent application Ser. No. 61/601,137 filed on Feb. 21, 2012 titled Interposer with Lateral Probe Points, which is hereby incorporated by reference.

BACKGROUND

To understand operation of a specific component in a circuit it is often necessary to characterize individual signals of the device while it is connected to other functional components. Where the signals are carried by connections which are not readily accessible, such as ball grid arrays, it can be very difficult to find an exposed trace or lead to probe with test equipment. Interposers are used to provide access to a signal from outside the footprint of the component. Often interposers are large socket type assemblies with long complex traces that introduce parasitics into the signal.

SUMMARY

An ideal interposer does not change the character of the signal in bringing it outside the component footprint. A low profile interposer with short traces and signal conditioning would provide an improved signal characterization solution.

An interposer associated with an integrated circuit package and a board under test including a substrate with a top surface, a bottom surface and edge surfaces connecting the top and bottom surfaces. An array of contacts on the substrate top surface are soldered to an array of contacts of the integrated circuit package and a corresponding array of contacts on the substrate bottom surface are soldered to contacts of the board under test. A through connection electrically connects each corresponding top contact to a corresponding bottom contact. A plurality of contacts on the edge or lateral surface makes an electrical connection between the plurality of edge surface contacts and at least one through connection.

In an alternative embodiment, a circuit test assembly is disclosed that includes an integrated circuit package with a contact array, a board under test with a contact array corresponding to the contact array of the integrated circuit and an interposer with a contact array on a top surface soldered to the contact array of the integrated circuit. A contact array on the interposer bottom surface is soldered to a corresponding contact array of the board under test. Further including an electrical connection between each of a set of top contacts and a corresponding bottom contact and at least one electrical connection between the probe point and a contact of the top array.

Alternatively, an edge of a circuit board connecting a top surface and a bottom surface is described having an exposed edge conductor spanning the edge from the top surface to the bottom surface electrically connected to a via that opens at the top surface and the bottom surface where the via that opens at the top surface and the bottom surface carries a signal between an integrated circuit to a board under test.

DETAILED DESCRIPTION

Figure 1:
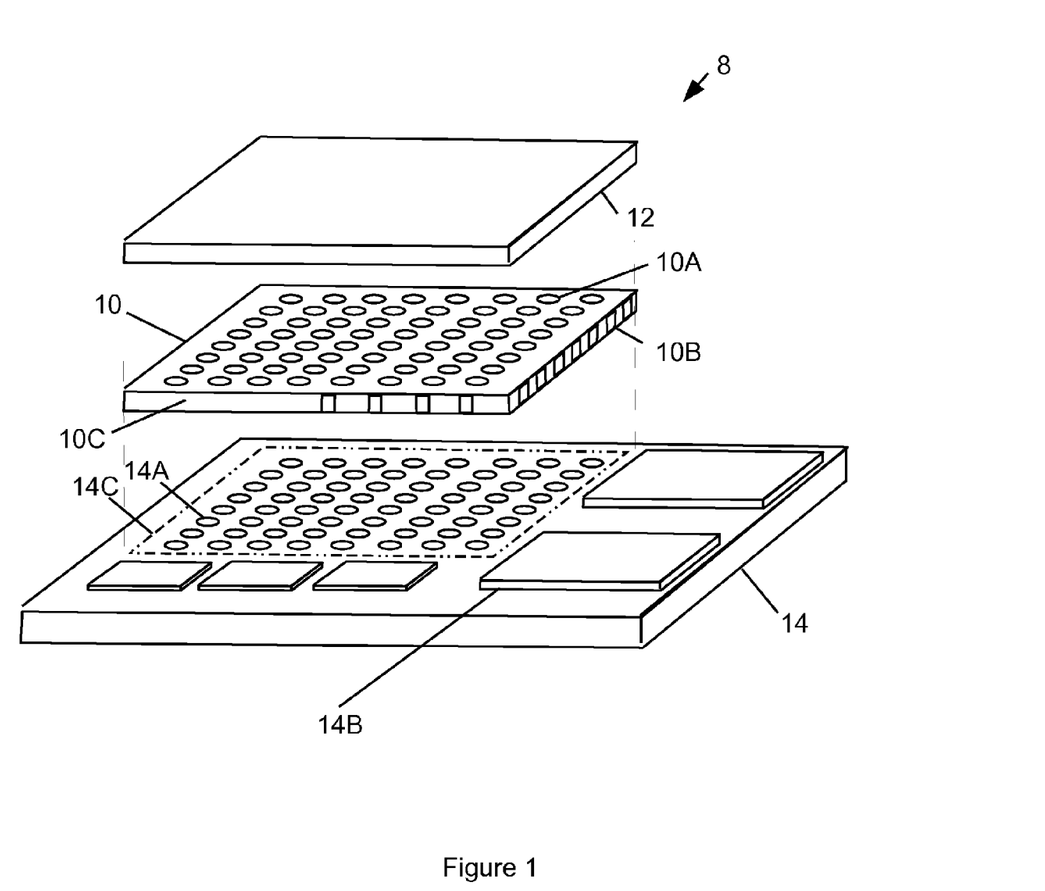
FIG. 1 is an exploded view of an interposer system including an integrated circuit, an interposer and a board under test.

FIG. 1 shows an interposer system 8 including an interposer 10, an integrated circuit or integrated circuit package 12 and a board under test 14. Interposer 10 is shown with surface contacts or pads 10A and probe points or edge contacts 10B on a lateral edge 100 of interposer 10.

Interposer 10 may include first and second sides each with a corresponding array of pads or contacts on an insulating substrate. An array of pads for only one side is shown. Each interposer pad may be electrically connected to a corresponding pad of the opposite side. Integrated circuit 12 and board under test 14 may each include a corresponding array of pads. Array of pads 14A of board under test 14 are shown and pads of integrated circuit 12 are not shown. The pads 14A are shown in an array. The array can include any number of contacts. The pad size and array configuration may vary and the pads can be vias, electroplated contacts with traces or other configuration.

When interposer 10 is assembled stacked between integrated circuit 12 and board under test 14, signals can pass between board under test 14 and integrated circuit 12 in a through connection between corresponding contacts. Contacts of the arrays may include solder and system assembly may include reflow of the solder. The arrays may be a ball grid array configuration with solder on each contact. Ball grid array configurations and connection methods are well known to those skilled in the art.

Board under test 14 may include additional board under test components 14B assembled to the board such as discrete passive components, memory and processors. Interposer 10 may have a footprint similar to integrated circuit 12 so interposer 10 may be assembled to board under test 14 without interfering with components 14B. Interposer 10 may be within the footprint 14C of integrated circuit 12 shown as projected on board under test 14 in FIG. 1. In an alternate configuration, interposer 10 profile may extend beyond the footprint 14C of integrated circuit 12 when attached the contact array of the board under test.

An array of contacts includes a plurality of contacts in a repeating pattern on one side of an insulating board. The repeating pattern may be repeating rows with contacts at regular intervals. The repeating pattern may include staggered rows of contacts. A separate set of contacts with the same repeating pattern occurs on the opposite side of the insulating board. If the insulating board has a point of origin at one corner and each contact on the bottom of the board has an orthogonal xy coordinate, the top of the board will have corresponding contacts with the same xy coordinate.

Some or all of contacts have an electrical connection between corresponding top and bottom contacts such as top and bottom pads with a trace between them or a via. A via for the purposes of this disclosure is a conductor that passes vertically through a circuit board opening to top and bottom surfaces of the board. The via may be a plated through hole, a trace or a filled hole that electrically connects a contact to a corresponding contact. Corresponding top and bottom contacts may include a plated pad, a solder ball or the exposed top of a via, Alternatively, corresponding top and bottom contacts may comprise the ends of a spring contact or other conductor passing through the board.

Figure 2:
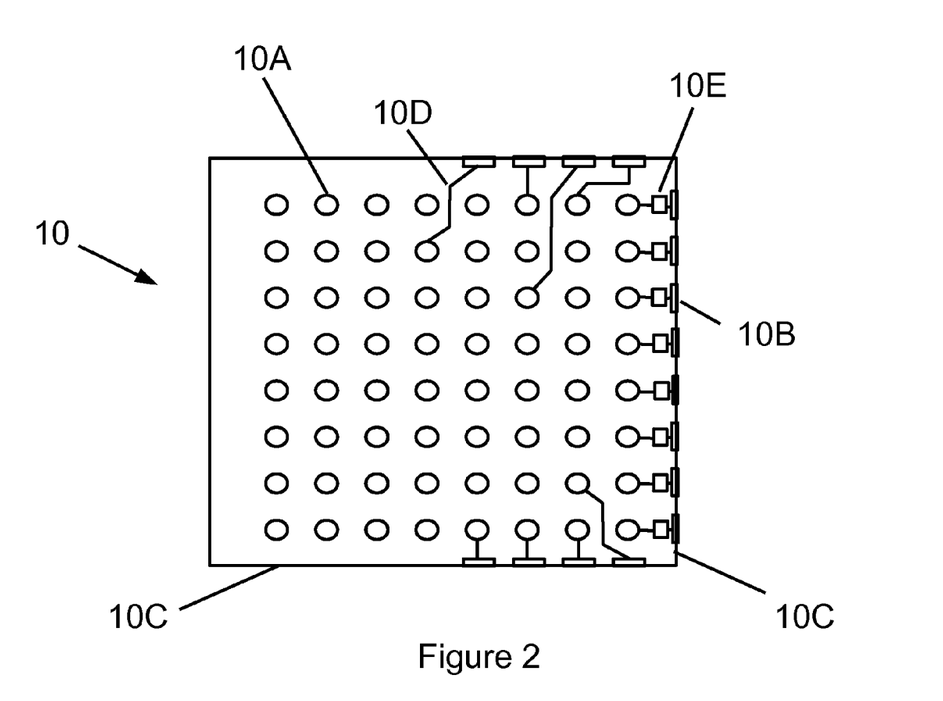
FIG. 2 shows a first embodiment of an interposer including pads, lateral edge contacts, traces connecting a pad to an edge contact and additional components.

FIG. 2 shows interposer 10 with pads 10A, edge contacts 10B on lateral edge 100 and traces or electrical connections 10D for carrying signals between a pad 10A and an edge contact 10B. Interposer 10 is also shown with components 10E which may include capacitors, resistors, diodes or other electrical components. Components 10E condition signals carried on traces 10D. Alternatively, interposer 10 may be free of electrical components other than conductors.

Figure 3:
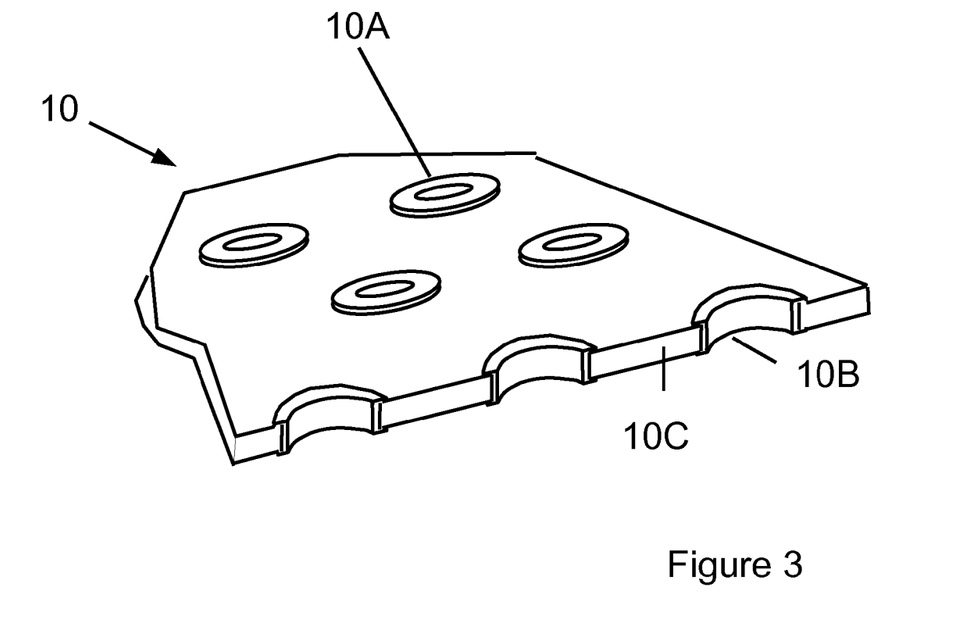
FIG. 3 is a perspective view of a portion of the interposer of FIG. 2, with portions of vias as edge contacts.

Creating an edge contact may include cutting through a circuit board so that one or more vias are sectioned and exposed by the cut. FIG. 3 is a perspective view of a portion of an interposer 10 similar to the previous figures. Here edge contact 10B is a portion of a via where the board edge 100 has been created by cutting through a substrate with vias. The cut through the board has passed through a row of vias so that a portion of each via is exposed on the edge to create a set of edge contacts 10B.

Alternatively, the edge contacts can be electroplated onto interposer edge 100 to create edge contact 10B. Other methods may be used and these techniques are well known to those skilled in the art.

Lateral edge 100 of interposer 10 includes the entire perimeter of interposer 10 connecting the top and bottom surfaces. The edge may be perpendicular to the top and bottom surfaces or edge 100 may be inclined to make it more accessible when assembled to the board under test. Edge contacts 10B may provide probe access to operating signals between board under test 14 and integrated circuit 12. Test equipment may access a signal at edge contact 10B.

Figure 4:
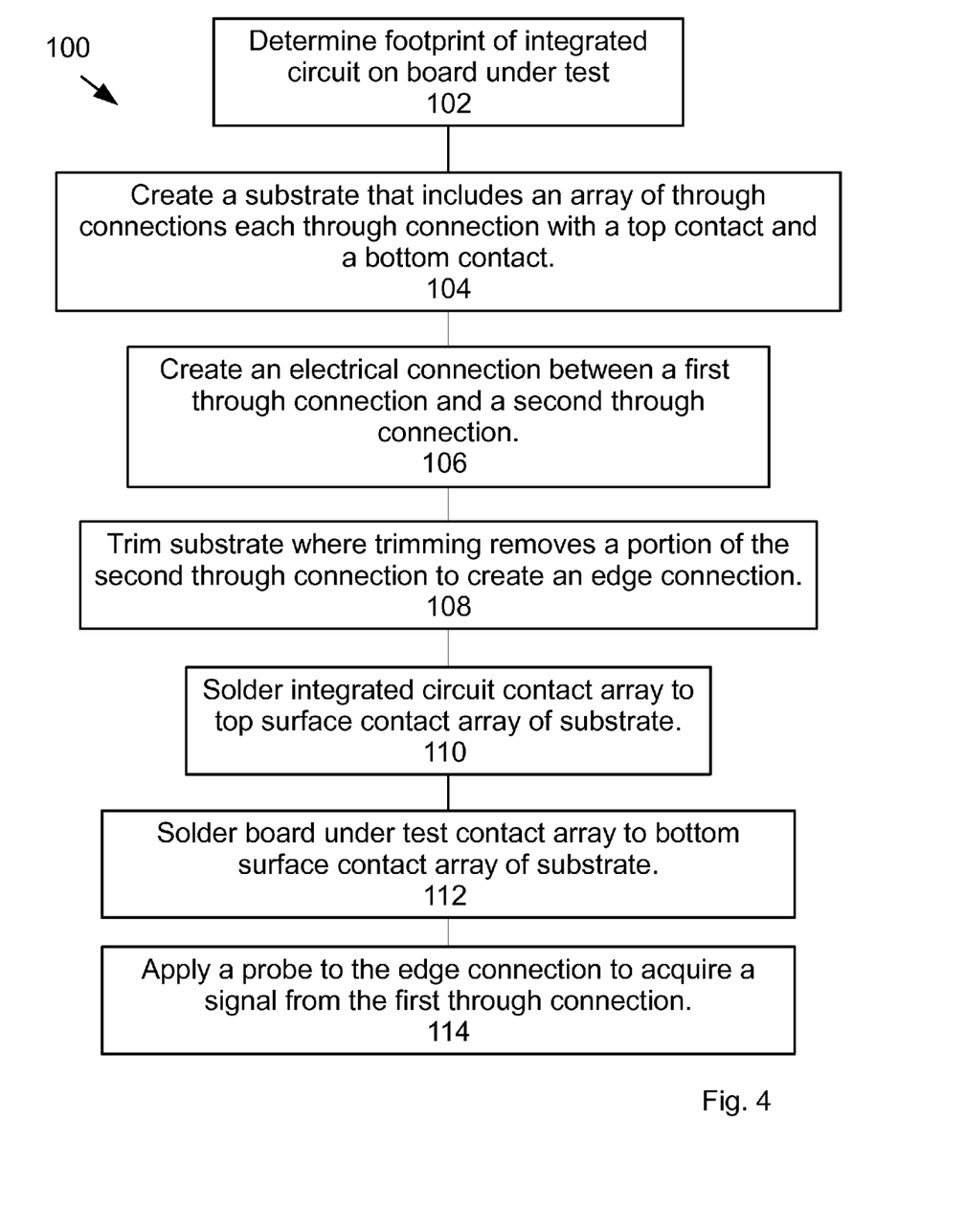
FIG. 4 is a flow chart of an interposer configuration method.

FIG. 4 is a flow chart of an interposer configuration method 100. In step 102 determine an integrated circuit footprint on a board under test where the board under test and the integrated circuit include corresponding contact arrays. In step 104 create a substrate that includes an array of through connections each with a top surface contact and a bottom surface contact. In step 106 include on the substrate at least one electrical connection between a first through connection and a second through connection. Trim the substrate in step 108, where trimming the substrate includes removing a portion of the second connection to create an edge connection. In step 110 solder the integrated circuit contact array to the top surface contact array of the substrate and solder the board under test contact array to the bottom surface contact array of the substrate in step 112. With the interposer assembled to the integrated circuit and the board under test to form a functioning electrical circuit, apply a probe to an edge connection to acquire a signal from the first through connection at step 114. Creating an electrical connection between first and second through connections may include connecting electrical components in the circuit.

This method of creating an interposer is reliable and low cost. The substrate of interposer 10 may be a multilayer substrate with traces on inner layers to create circuits. Electrical components such as resistors, capacitors and inductors may be configured on inner layers as well. Electrical components may be included on the substrate surface. The substrate of interposer 10 may be FR4, ceramic or other insulating material. Contacts and electrical connections may be copper, lead, silver aluminum or other conductor. The steps of method 100 may be performed in any order. The order shown is an example for explanation.

The physical configurations shown are examples for the purpose of explanation as well. Interposer 10 may have any number of pads and edge contacts and may be in a configuration different than that shown here. Interposer 10 may be configured to be used with interconnection systems other than ball grid arrays.

Figure 5:
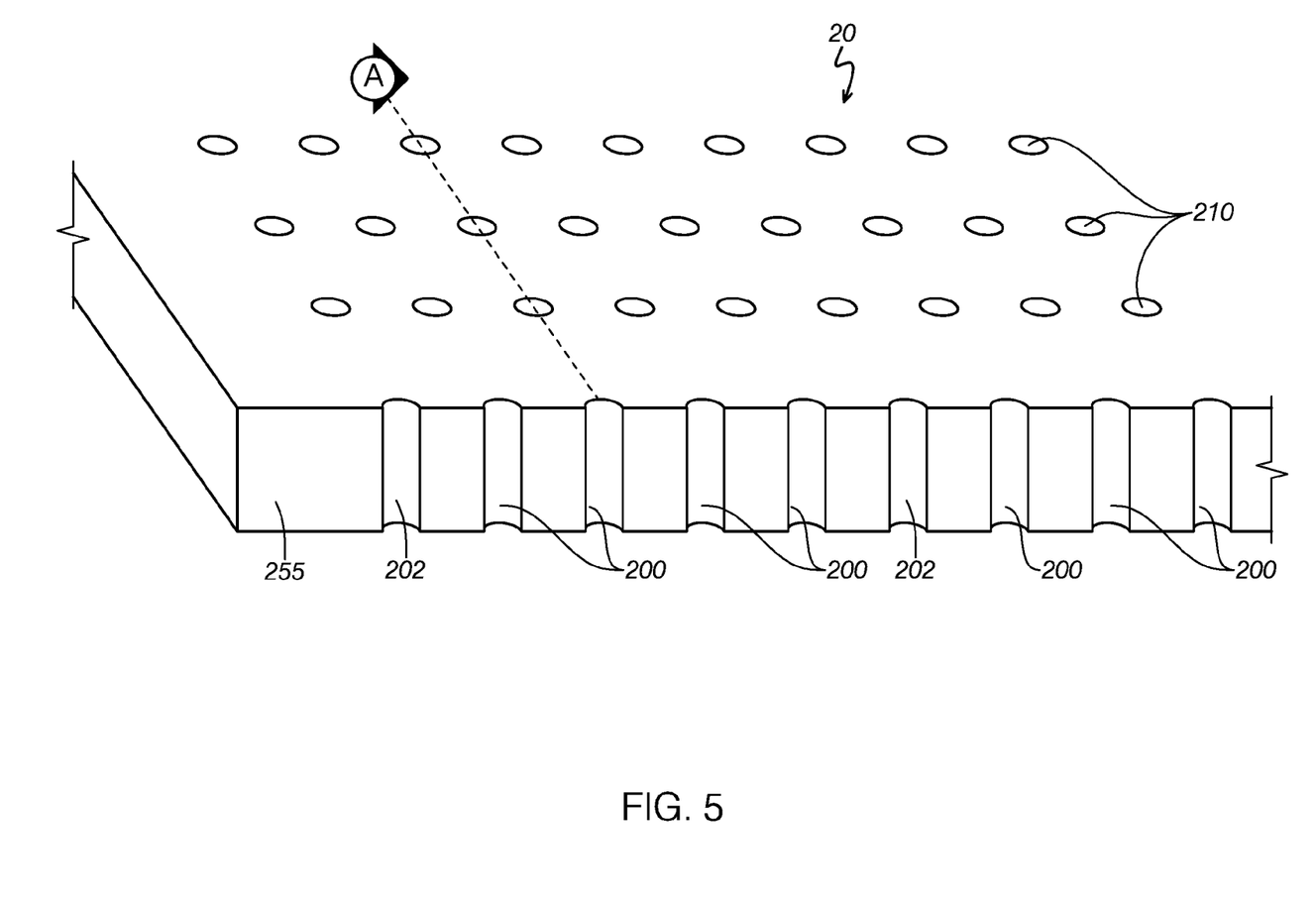
FIG. 5 is a perspective view of a portion of a second embodiment of an interposer.
Figure 6:
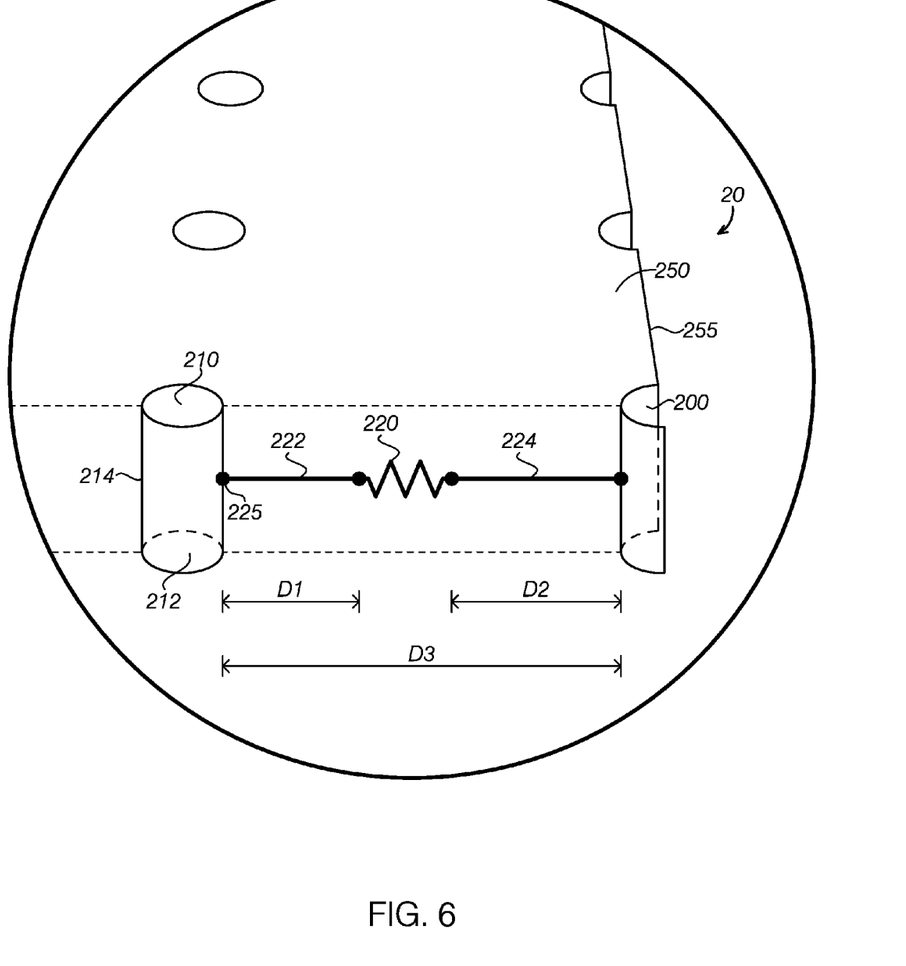
FIG. 6 is a cross section view of the interposer of FIG. 5, showing an embedded resistor between the through connection and the edge contact.
Figure 7:
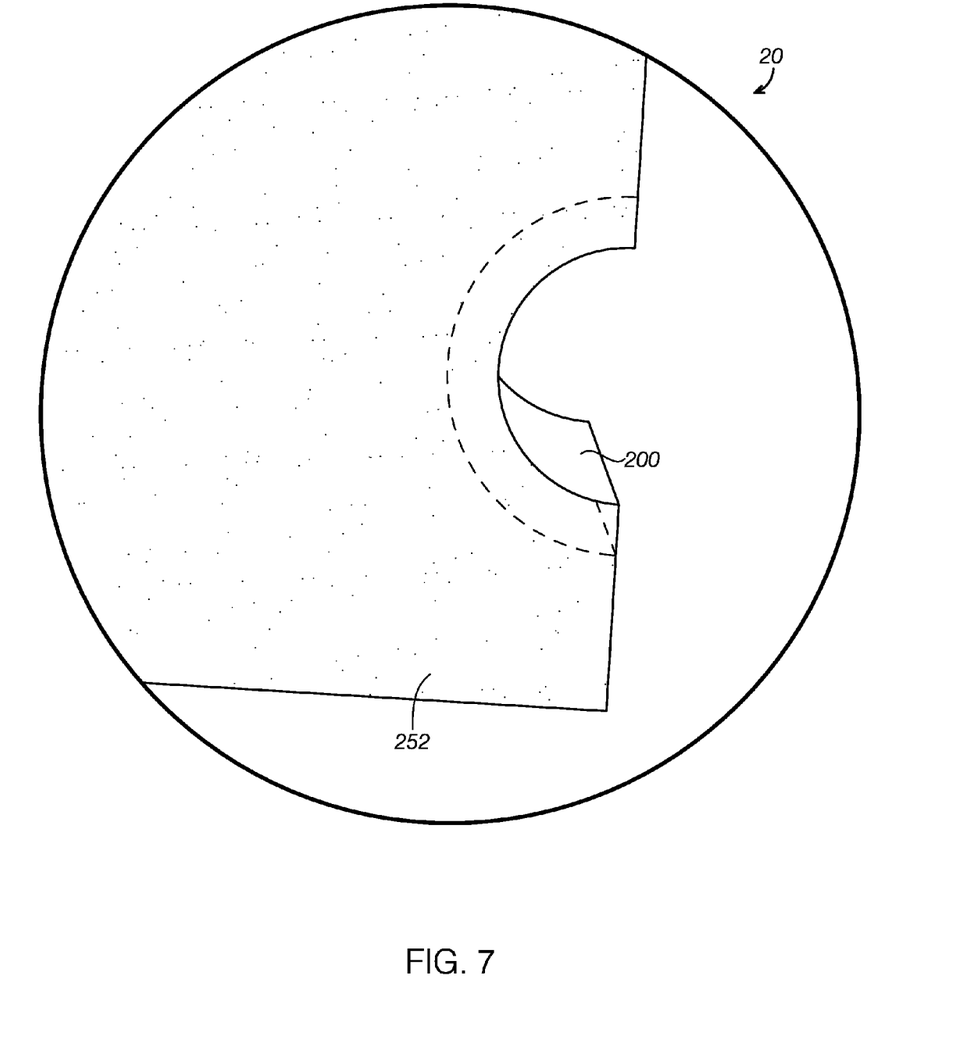
FIG. 7 is perspective view of a portion of the bottom surface of the interposer of FIGS. 5 and 6.

Turning now to FIGS. 5-7, a second embodiment of an interposer, interposer 20 is shown. Interposer 20 includes many similar or identical features to interposer 10. Thus, for the sake of brevity, each feature of interposer 20 will not be redundantly explained. Rather, key distinctions between interposer 20 and interposer 10 will be described in detail and the reader should reference the discussion above for features substantially similar between the two interposers.

Interposer 20 may be particularly useful in testing of modern circuit boards which may be crowded with ever shrinking components (e.g., memory and/or processing components). Specifically, interposer 20 is configured with a tightly packed array of through connections and miniaturized edge connections to allow testing of components, even those in stacked Package On Package (PoP) configuration. Furthermore, interposer 20 may include embedded signal-conditioning resistors configured to minimize the length of unconditioned signal pathways, thus reducing inductance and noise in the signal being tested. Additionally, interposer 20 may include ground probe points dispersed along the edges to minimize the length of ground pathways.

As can be seen in FIGS. 5-7, interposer 10 comprises a top surface 250, a bottom surface 252, and one or more edge surfaces 255, thereby defining the volume of the interposer. Interposer 20 includes an array of top contacts 210 on the top surface 250, a corresponding array of bottom contacts 212 on the bottom surface 252, and a plurality of edge contacts 200, 202 on the edge surface(s) 255. The plurality of edge contacts comprises signal probe points 200, and ground probe points 202. Through connections 214 electrically connect the top contacts 210 to their corresponding bottom contacts 212.

As can be seen in FIG. 5, edge surface 255 may include signal probe points 200 and ground probe points 202. The probe points 200, 202 may be configured to receive the end of electrical probe. In this regard, the probe points 200, 202 may be formed in a semi-cylindrical shape.

Signal probe points 200 are configured to intercept electrical signals traveling through the through connections 210, for example between a printed circuit board (PCB) below interposer 20 and a component above. In another example, signal probe points 200 may intercept electrical signals traveling through the through connections 210 between a System On a Chip (SOC) in a Package On Package (PoP) configuration below interposer 20, and a component above.

Turning now to FIG. 6, a cross-sectional view of a portion of interposer 20 is shown. The cross-section of FIG. 6 is taken along the line marked A in FIG. 5. As can be seen in FIG. 6, the illustrated through connection 214 connects top contact 210 with bottom contact 212. An electrical pathway connects the illustrated through connection 214 to the signal probe point 200 over a distance D3. In this regard, the signals passing between the top and bottom contacts 210, 212 may be inspected and/or analyzed via a probe inserted into the signal probe point 200.

In some embodiments, a probe, such as an oscilloscope, may be used to sample the signal via signal probe point 200. In these embodiments, resonance between the tip of the probe and signals passing between the top and bottom contacts 210, 212 may occur. This resonance may result in an undesirable altering of the signal received by the probe.

Thus, the electrical pathway between through connection 214 and signal probe point 200 may include a resistor 220. The resistor 220 may condition the signal being transmitted to the probe and thereby function to reduce the resonance. In this regard, the electrical pathway may comprise an unconditioned signal pathway 222 between through connection 214 and resistor 220. Further, the electrical pathway may comprise a conditioned signal pathway 224 between resistor 220 and signal probe point 200.

Unconditioned signal pathway 222 may contact the through connection 214 at an intersection point 225. From intersection point 225, unconditioned signal pathway 222 may run to resistor 220 where, as described above, it may be conditioned before being passed through conditioned signal pathway 224 to signal probe point 200.

Thus, as shown in FIG. 6, the unconditioned signal must travel a distance D1 before reaching resistor 220. It has been found that by minimizing the distance D1 that the unconditioned signal must travel, the resonance between the signal being sampled and the tip of the probe may be further reduced or altogether eliminated. In this regard, in some embodiments, unconditioned signal pathway may have a length D1 of not greater than 0.20 inch. In other embodiments, unconditioned signal pathway may have a length D1 of not greater than 0.15 inch. In still other embodiments, unconditioned signal pathway may have a length D1 of not greater than 0.10 inch.

As shown in FIG. 6, intersection point 225 may be embedded within the volume of interposer 20, between top surface 250 and bottom surface 252. Furthermore, resistor 220 and conditioned signal pathway 224 may be embedded within the volume of interposer. Thus, length D1 may be further minimized. Additionally, by embedding resistor 220 within the volume of interposer 20, top and bottom surfaces 250, 252 of interposer 20 may be kept free of resistors and other components, thereby allowing a maximum density of through connections in interposer 20.

In a preferred embodiment, resistor 220 may be a thin film planar resistor. Thus, resistor 220 may be incorporated into one or more layers of the interposer thereby facilitating the embedding of the resistor. Resistor 220 may be comprised of a conducting layer and a thin-film resistive layer electrodeposited onto the conducting layer. In one embodiment, the conducting layer may comprise copper (e.g., a copper foil). In one embodiment, the thin-film resistive layer comprises a nickel-phosphorous material.

Turning back to FIG. 5, edge surface 255 may include one or more ground probe points 202. Ground probe points 202 are configured to prove a path to ground for the intercepted signals. A ground probe point 202 may be electrically connected to a dedicated through connection. The dedicated through connection may in turn be connected to ground via a board or component below the interposer 20. The electrical connection between a ground probe point 202 and a dedicated through connection may be an unrestricted electrical pathway. In this regard, the unrestricted electrical pathway may be free of any resistor.

The ground probe points 202 may be generally evenly dispersed along the edge surface 255. In this regard, the distance from each signal probe point 200 to the closest ground probe point may be minimized. Thus, after a signal has been intercepted, the length of the electrical pathway to ground may be minimized by utilizing a nearby ground probe point 202. It has been discovered that by minimizing the electrical pathway to ground in this manner, better signal integrity may be maintained, especially in combination with a minimized unconditioned signal path length as described above.

In some embodiments, interposer 20 may include at least one ground probe point 202 for every four signal probe points 200. The ground probe points are preferably even dispersed, thereby forming a repeating pattern. For example, as illustrated in FIG. 5, moving along edge surface 255 from left to right may reveal a pattern of one ground probe point 202, followed by four signal probe points 200, followed by one ground probe point 202, followed by one signal probe point 200 and so on.

In other embodiments, additional ground probe points may be included, so long as there are at least one ground probe points for every four signal probe points. For example, in some embodiments, edge surface 255 may include one ground probe point for every three signal probe points. In other embodiments, edge surface 255 may include one ground probe point for every two signal probe points.

Turning now to FIG. 7, a portion of the bottom surface 252 of interposer 20 is shown. The illustrated portion of the bottom surface 252 includes a signal probe point 200. In some embodiments, particularly for small scale applications (e.g., holes that are about 15 mils or less in diameter before plating), it has been found that the method of cutting a via in half may damage or destroy the via plating. To rectify this, the damaged half cylinder may be cleaned and then mechanically finished. Then, a final gold plating may be added to the surfaces of the half cylinder, thereby producing the signal probe point 200.

To complete the interposer 20, a soldermask covering may be applied to the bottom surface 252 of interposer 20. As shown, the soldermask covering may cover the bottom surface of signal probe point 200. Thus, probe point 200 may be less prone to making unwanted electrical contact with a component beneath interposer 20.

The disclosure above encompasses multiple distinct inventions with independent utility. While each of these inventions has been disclosed in a particular form, the specific embodiments disclosed and illustrated above are not to be considered in a limiting sense as numerous variations are possible. The subject matter of the inventions includes all novel and non-obvious combinations and subcombinations of the various elements, features, functions and/or properties disclosed above and inherent to those skilled in the art pertaining to such inventions. Where the disclosure or subsequently filed claims recite "a" element, "a first" element, or any such equivalent term, the disclosure or claims should be understood to incorporate one or more such elements, neither requiring nor excluding two or more such elements.

Applicant(s) reserves the right to submit claims directed to combinations and subcombinations of the disclosed inventions that are believed to be novel and non-obvious. Inventions embodied in other combinations and subcombinations of features, functions, elements and/or properties may be claimed through amendment of those claims or presentation of new claims in the present application or in a related application. Such amended or new claims, whether they are directed to the same invention or a different invention and whether they are different, broader, narrower or equal in scope to the original claims, are to be considered within the subject matter of the inventions described herein.

The invention claimed is:

1. An interposer comprising:
   a top surface;
   a bottom surface;
   at least one edge surface connecting the top and bottom surfaces, thereby defining a volume of the interposer;
   an array of top contacts on the top surface configured to interface with an integrated circuit package;
   a corresponding array of bottom contacts on the bottom surface configured to interface with a component beneath the interposer;
   through connections between corresponding top and bottom contacts;
   a plurality of signal probe points on the edge surface;
   an electrical pathway connecting a first through connection to a first signal probe point;
      wherein the electrical pathway contacts the first through connection at a first intersection; and
   a resistor disposed along the electrical pathway, between the first intersection and the first signal probe point;
      wherein the electrical pathway from the first intersection to the resistor is an unconditioned signal pathway;
      wherein the electrical pathway from the resistor to the first signal contact is a conditioned signal pathway; and
      wherein the unconditioned signal pathway has a length of not greater than 0.20 inch.

2. The interposer of claim 1, wherein the length of the unconditioned signal pathway is not greater than 0.15 inch.

3. The interposer of claim 1, wherein the length of the unconditioned signal pathway is not greater than 0.10 inch.

4. The interposer of claim 1, wherein the resistor comprises:
   a conductive layer; and
   a thin film resistive layer electrodeposited onto the conductive layer.

5. The interposer of claim 4, wherein the thin film resistive layer comprises a nickel-phosphorous material and wherein the conductive layer comprises copper foil.

6. The interposer of claim 1, comprising at least one ground probe point on the edge surface.

7. The interposer of claim 6, wherein the ground probe point is connected to a second through connection, and wherein the second through connection is connected to ground.

8. The interposer of claim 7, wherein the ground probe point is connect to the second through connection via an unrestricted electrical pathway, wherein the unrestricted electrical pathway is free of any resistors.

9. The interposer of claim 1, comprising a plurality of ground probe points in a ratio of at least 1 ground probe point to every four signal probe points.

10. The interposer of claim 1, wherein the bottom surface of the interposer is electrically insulated at the signal probe points.

11. The interposer of claim 1, wherein the component beneath the interposer is a System On a Chip (SOC) in a Package On Package (PoP) configuration.

12. The interposer of claim 1, wherein the component beneath the interposer is a printed circuit board (PCB).

13. The interposer of claim 1, wherein the interposer comprises a plurality of electrical pathways, each one connecting a respective one of the through connections, via one of a plurality of intersections, to a respective one of the signal probe points;
   wherein the interposer comprises a plurality of resistors, each one disposed along a respective one of the electrical pathways
   wherein each electrical pathway from its respective intersection to its respective resistor is an unconditioned signal pathway;
   wherein each electrical pathway from its respective resistor to its respective signal probe point is a conditioned signal pathway; and
   wherein each unconditioned signal pathway has a length of not greater than 0.20 inch.

14. The interposer of claim 13, wherein the length of each of the unconditioned pathways is not greater than 0.15 inch.

15. The interposer of claim 13, wherein the length of each of the unconditioned pathways is not greater than 0.10 inch.

* * * * *